(12) United States Patent
Wang et al.

(10) Patent No.: US 8,026,172 B2
(45) Date of Patent: Sep. 27, 2011

(54) METHOD OF FORMING CONTACT HOLE ARRAYS USING A HYBRID SPACER TECHNIQUE

(75) Inventors: Chun-Ming Wang, Fremont, CA (US);
Chenche Huang, Campbell, CA (US);
Masaaki Higashitani, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 205 days.

(21) Appl. No.: 12/458,017

(22) Filed: Jun. 29, 2009

(65) Prior Publication Data
US 2010/0330806 A1   Dec. 30, 2010

(51) Int. Cl.
*H01L 21/4763* (2006.01)
(52) U.S. Cl. ......... 438/637; 438/668; 438/672; 438/675
(58) Field of Classification Search .................. 438/637, 438/639, 666, 668, 672, 674, 675
See application file for complete search history.

(56) References Cited

U.S. PATENT DOCUMENTS

| | | | | |
|---|---|---|---|---|
| 6,362,057 B1 * | 3/2002 | Taylor et al. | ................. | 438/286 |
| 6,706,571 B1 * | 3/2004 | Yu et al. | ........................ | 438/157 |
| 6,893,972 B2 * | 5/2005 | Rottstegge et al. | ........... | 438/706 |
| 2007/0049035 A1 | 3/2007 | Tran | | |
| 2007/0049040 A1 * | 3/2007 | Bai et al. | ........................ | 438/712 |
| 2007/0190762 A1 | 8/2007 | Franciscus Van Haren et al. | | |
| 2007/0215960 A1 * | 9/2007 | Zhu et al. | ....................... | 257/414 |
| 2008/0076070 A1 | 3/2008 | Koh et al. | | |
| 2008/0090419 A1 | 4/2008 | Koh et al. | | |
| 2009/0155962 A1 | 6/2009 | Petti et al. | | |

OTHER PUBLICATIONS

International Search Report and Written Opinion, Intl. Application PCT/US2010/038125. International Searching Authority: European Patent Office (ISA/EP), Sep. 13, 2010.
U.S. Appl. No. 12/149,151, filed Apr. 28, 2008, Yung-Tin Chen et al.
U.S. Appl. No. 12/289,396, filed Oct. 27, 2008, Yung-Tin Chen et al.
U.S. Appl. No. 12/318,609, filed Dec. 31, 2008, Yung-Tin Chen et al.

* cited by examiner

*Primary Examiner* — Kevin M Picardat
(74) *Attorney, Agent, or Firm* — The Marbury Law Group, PLLC (57) ABSTRACT

One embodiment of the invention provides a method of forming a plurality of contact holes, including forming a first feature and a second feature over an underlying material, forming sidewall spacers on the first and second features, removing the first and second features without removing the sidewall spacers, forming a cover mask at least partially exposing the sidewall spacers, and etching the underlying material using the cover mask and the sidewall spacers as a mask to form the plurality of contact holes.

17 Claims, 8 Drawing Sheets

METHOD OF FORMING CONTACT HOLE ARRAYS USING A HYBRID SPACER TECHNIQUE

BACKGROUND OF THE INVENTION

The invention relates generally to a method for making a semiconductor device, for example, a method of forming contact holes in a nonvolatile memory array.

Figure 1:
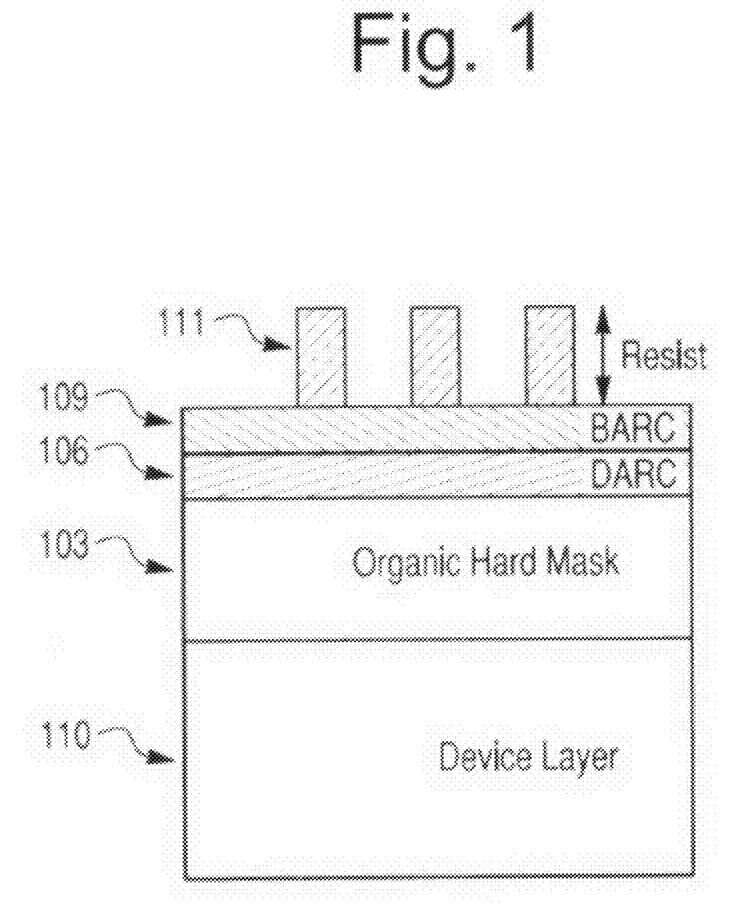
FIG. 1 is a side-cross sectional view illustrating a prior art hard mask configuration.

One prior art process using a hard mask stack, as shown in FIG. 1, can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer. A device layer 110 can be etched using at least one or more layers of the stack as a mask.

In conventional patterning, such as double printing, resolution below 38 nanometers is not achievable. Alternate technologies for approaching 24 nm contact hole resolution is very difficult and involves the use of 2-row staggered arrays. To perform even smaller hole patterning, such as below 22 nm, 3-row staggered arrays may be required resulting in additional difficulties, such as increased reliance on optical proximity correction and sub-resolution assist features.

SUMMARY OF THE EMBODIMENTS

One embodiment of the invention provides a method of forming a plurality of contact holes, including forming a first feature and a second feature over an underlying material, forming sidewall spacers on the first and second features, removing the first and second features without removing the sidewall spacers, forming a cover mask at least partially exposing the sidewall spacers, and etching the underlying material using the cover mask and the sidewall spacers as a mask to form the plurality of contact holes.

Another embodiment of the invention provides a method of forming a plurality of contact holes, including forming at least one underlying layer over a substrate, forming a plurality of spaced apart features over the at least one underlying layer, forming a spacer layer over the features and the at least one underlying layer, etching the spacer layer to form a spacer pattern comprising a plurality of spacer shells, wherein each one of the spacer shells is formed so as to completely surround sidewalls of a respective one of the features while exposing an upper surface of each feature and portions of the underlying layer located between adjacent spacer shells. The method also includes removing the features without removing the spacer shells to expose top portions of the underlying layer below locations previously occupied by the features, forming a cover mask comprising at least a first strip portion and a second strip portion of cover mask material formed spaced apart and substantially parallel to one another such that the first strip portion covers a first wall and the second strip portion covers an opposing second wall of each of the spacer shells, and etching exposed portions of the underlying layer below locations previously occupied by the features and at locations between each of the plurality of spacer shells to form the plurality of contact holes.

DETAILED DESCRIPTION OF THE EMBODIMENTS

One embodiment of the invention provides a method of forming a plurality of contact holes, including forming a first feature and a second feature over an underlying material, forming sidewall spacers on the first and second features, removing the first and second features without removing the sidewall spacers, forming a cover mask at least partially exposing the sidewall spacers, and etching the underlying material using the cover mask and the sidewall spacers as a mask to form the plurality of contact holes. In some embodiments, the underlying material comprises an insulating material.

Figure 2A:
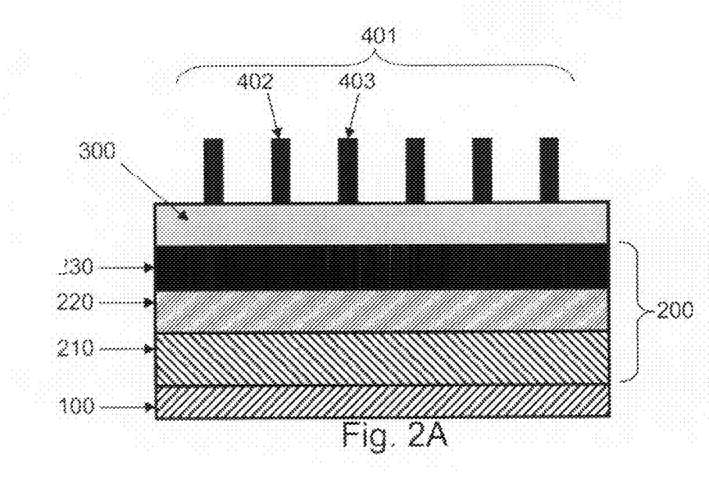
FIGS. 2A-2F are side cross-sectional views illustrating stages in formation of a device according to an embodiment of the present invention.

Referring to FIG. 2A, an underlying layer 200 is formed over a substrate 100. The substrate 100 can be any semiconductor substrate known in the art, such as monocrystalline silicon, IV-IV compounds such as silicon-germanium or silicon carbide, III-V compounds, II-VI compounds, epitaxial layers over such substrates, or any other semiconductor or non-semiconductor material, such as glass, plastic, metal or ceramic substrate. The substrate may include integrated circuits fabricated thereon, such as driver circuits and/or electrodes for a memory device.

The underlying layer 200 may comprise a second hard mask layer 230, an underlying hard mask layer 220, a device layer 210, or combinations thereof. For example, as shown in FIG. 2A, the underlying layer 200 may comprises a device layer 210, an underlying hard mask layer 220 formed over the device layer 210, and a second hard mask layer 230 formed over the underlying mask layer 220.

The second hard mask layer 230 may comprise any suitable hard mask material including oxide, nitride, polysilicon, amorphous silicon, or metal. In one preferred embodiment, the second hard mask layer 230 comprises a silicon oxide or silicon oxynitride hard mask layer. In another preferred embodiment, the second hard mask layer 230 comprises polysilicon. Preferably, the second hard mask layer 230 comprises a material different from the material of the first hard mask layer 300, so that the second hard mask layer 230 may act as an etch stop during steps of etching the first hard mask layer 300. The second hard mask layer 230 may have any suitable thickness, and preferably has a thickness of 30 to 60 nanometers.

The underlying hard mask layer 220 may comprise any suitable hard mask materials, and in a preferred embodiment, comprises an organic hard mask, such as amorphous carbon advanced patterning film ("APF"). The underlying hard mask layer 220 may have a thickness of 120 to 250 nanometers. In an alternative embodiment, the first mask layer 300 may comprise an amorphous silicon layer and the underlying layer 200 comprises a DARC hard mask layer over the device layer 210. Other layer combinations may also be used.

The device layer 210 may comprise any suitable material, for example, semiconductor materials, insulating materials, or conductive materials. For example, in one preferred embodiment, the device layer 210 is one or more insulating layers, such as silicon oxide, silicon nitride, organic insulating layers, etc.

A first mask layer 300 can be formed over the underlying layer 200. The first mask layer 300 may comprise any suitable hard mask material. In a preferred embodiment, the first mask layer 300 comprises a DARC layer, such as a silicon oxynitride layer, having a thickness from 15 to 40 nanometers. As noted above, layer 300 may comprise an a-Si layer instead.

Figure 3A:
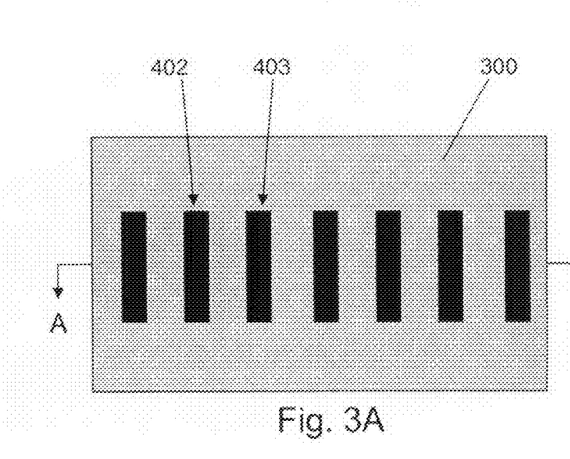
FIGS. 3A-3F are top views of the structures shown in FIGS. 2A-2F, respectively, with A-A' indicating the view in FIGS. 2A-2F.

A plurality of spaced apart features 401 comprising at least one of a first feature 402 and at least one of a second feature 403 can then be formed over the first mask layer 300. As shown in FIGS. 2A and 3A, the first mask layer 300 can be partially exposed in openings between each of the plurality of features, for example between first feature 402 and second feature 403. In some embodiments, features 401 may be photosensitive material features. In some embodiments, features 401 can be photoresist features, a combination BARC and photoresist features, or may comprise amorphous carbon features. Alternatively, the features 401 can be features comprising any other suitable materials, such as oxides, nitrides, or metals. The features 401 may initially be formed having a width of 38 nm using conventional lithography techniques. A photoresist trimming process (not shown), such as an isotropic etch, may be utilized to reduce the width of features 401 to about 19 nm. Other widths may also be used.

Figure 2B:
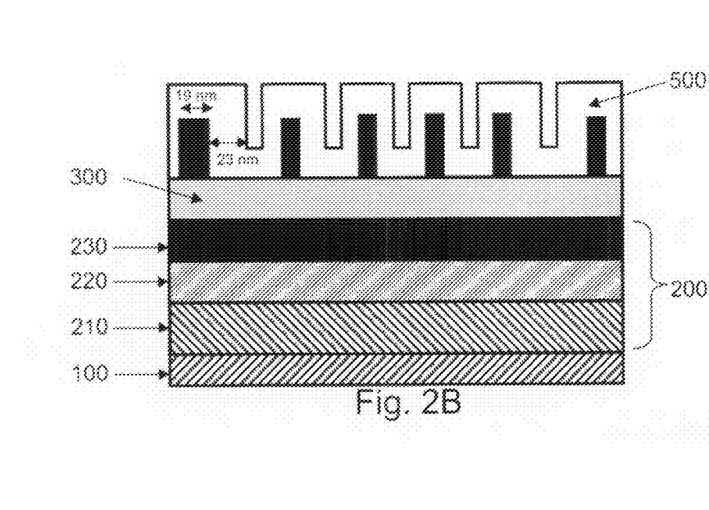
Figure 3B:
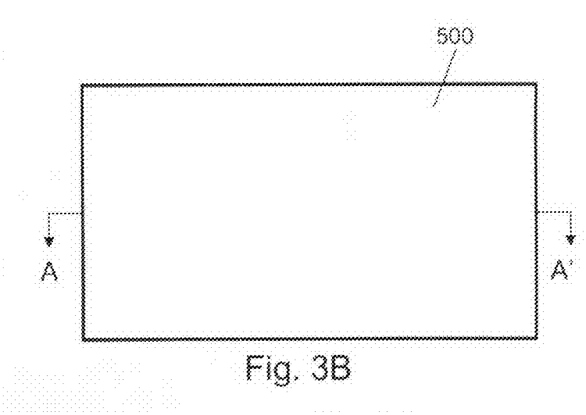

Turning to FIG. 2B and FIG. 3B, a first spacer layer 500 can be formed over the first features 401. The first spacer layer 500 comprises a first material different from the material of features 401. The spacer layer 500 may comprise any layer which is deposited at a sufficiently low temperature to avoid damaging the features 401 and which can withstand resist stripping without being removed. For example, layer 500 may comprise a low temperature silicon oxide layer deposited by atomic layer deposition (ALD or PLD) or by CVD at a temperature of 20-100, such as 80-100° C. In FIG. 3B only spacer layer 500 is shown without the underlying layers and features being visible. However, spacer layer 500 may be optically transparent or translucent.

Figure 2C:
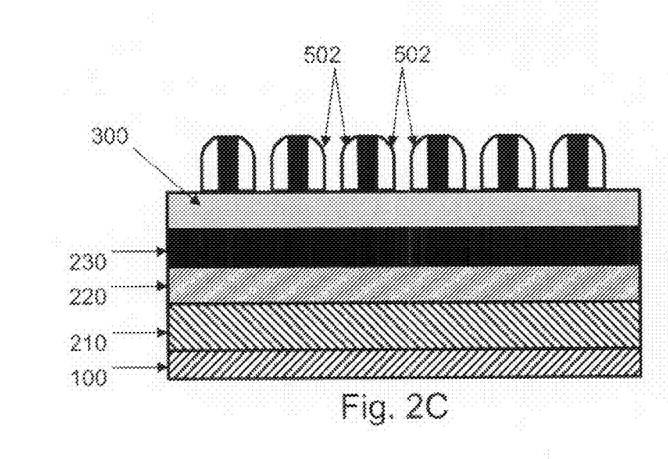
Figure 3C:
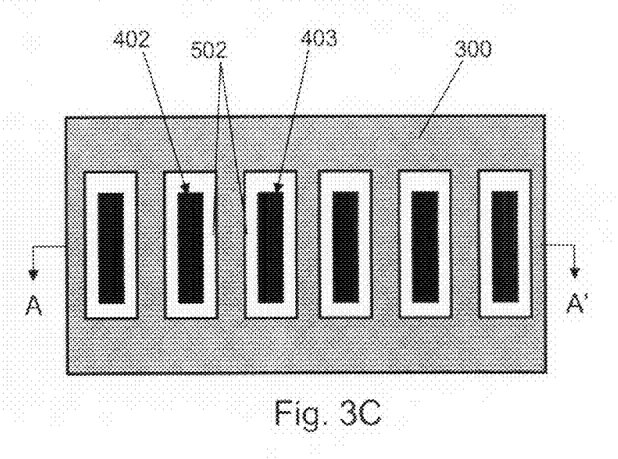

The first spacer layer 500 can then be etched using a spacer etch process to form a first spacer pattern (which can also be referred to as spacer features or sidewall spacers) 502 and to expose top of the features 401, resulting in a structure illustrated in FIG. 2C and FIG. 3C. In some embodiments a width of the first feature is substantially equal to a width of the second feature and substantially equal to a width of a space between a sidewall spacer on the first feature and an adjacent sidewall spacer on the second feature. For example, the width of the space may be about 19 nm. In some embodiments, features 401 comprises a photoresist upper portion and at least one of DARC and hard mask lower portion, and the sidewall spacers 502 cover sidewalls of the upper and lower portions of the features. In these embodiments, the features 401 are used as a mask to etch underlying DARC and/or hard mask layers. The sidewall spacers are then formed on the sidewalls of the combined photoresist and DARC/hard mask pillars. If desired, the photoresist may be removed prior to forming the spacers on the side of the DARC/hard mask pillars.

Figure 2D:
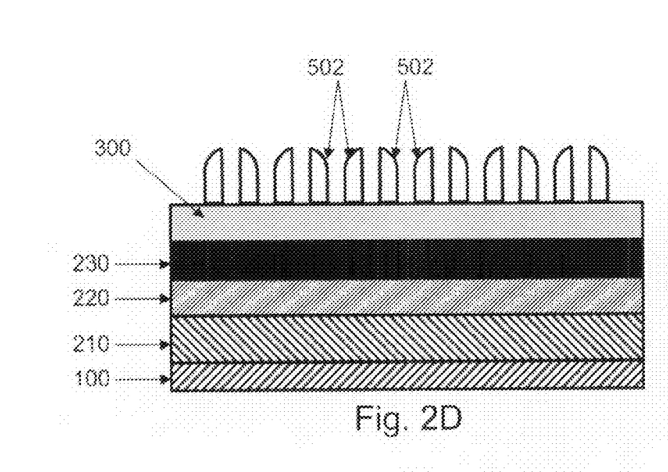
Figure 3D:
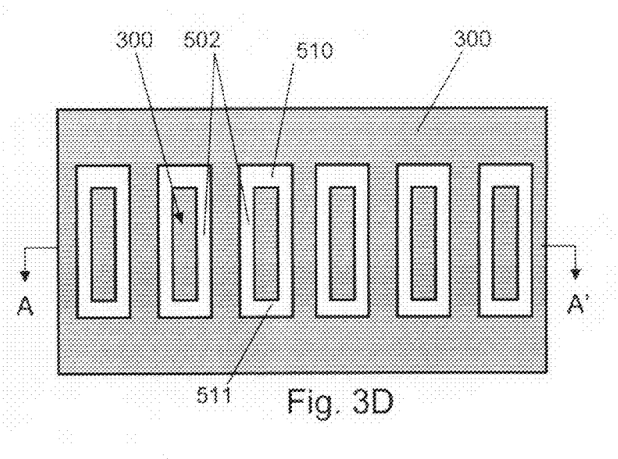

As seen in FIG. 3C, first spacer pattern 502 appears as a plurality of spacer shells which completely surround the sidewall(s) of each of the features 401, with the tops of the features 401 exposed. The features 401, for example at least first feature 402 and second feature 403, can then be removed (e.g., stripped) without removing pattern 502 thereby exposing portions of first mask layer 300 that were previously covered by features 401, as shown in FIG. 2D and FIG. 3D. Also shown in FIG. 3D are portions of pattern 502 defining a first wall 510 and an opposing second wall 511 of the spacer shells.

Figure 2E:
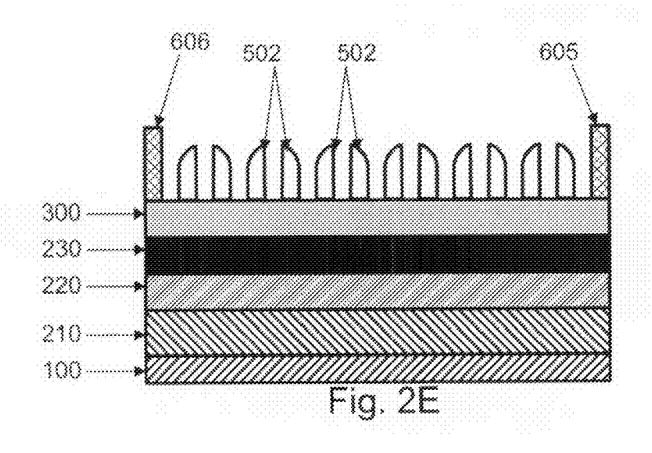
Figure 2F:
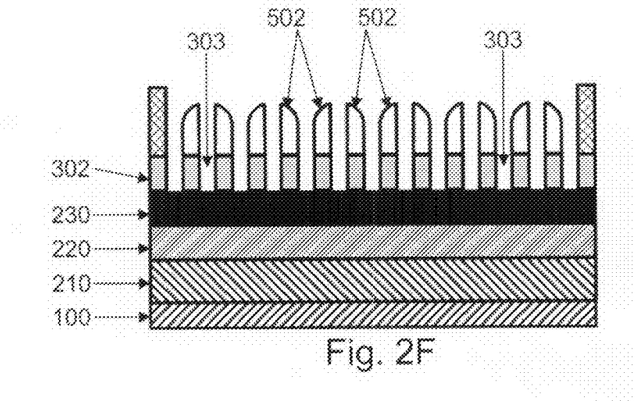
Figure 3E:
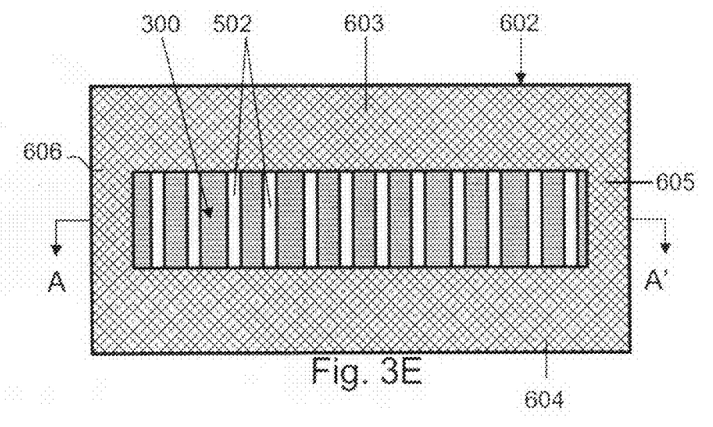

As shown in FIG. 2E and FIG. 3E, a cover mask 602, for example a photoresist pattern, can be formed so as to at least partially expose the sidewall spacers and portions of first mask layer 300. Thus, the cover mask and the sidewall spacers may serve to mask portions of layer 300, such as those portions not exposed in FIG. 3E, during a subsequent etching of uncovered portions layer 300. In other words, the cover mask 602 may comprise at least a first strip portion 603 and a second strip portion 604 of cover mask material formed spaced apart and substantially parallel to one another such that the first strip portion covers first wall 510 (not visible in FIG. 3E) and the second strip portion covers opposing second wall 511 (not visible in FIG. 3E) of each of the spacer shells. Additionally, the cover mask may also comprise a third strip portion 605 of cover mask material formed above the underlying layer, for example first mask layer 300, thereby connecting a first end of the first strip portion and a first end of the second strip portion, and a fourth strip portion 606 of cover mask material formed above the underlying layer thereby connecting a second end of the first strip portion and a second end of the second strip portion, as shown in FIG. 3E. The third and fourth strip portions may each be substantially perpendicular to the first and second strip portions, and the spacer shells 502 are located between the third and fourth strip portions, as shown in FIG. 3E. Thus, in the subsequent etching step, the first spacer pattern 502 and portions of cover mask 602 can be used as a mask in the subsequent step of etching the first hard mask layer 300 resulting in the formation of first hard mask features 302, as shown in FIG. 2F.

Figure 3F:
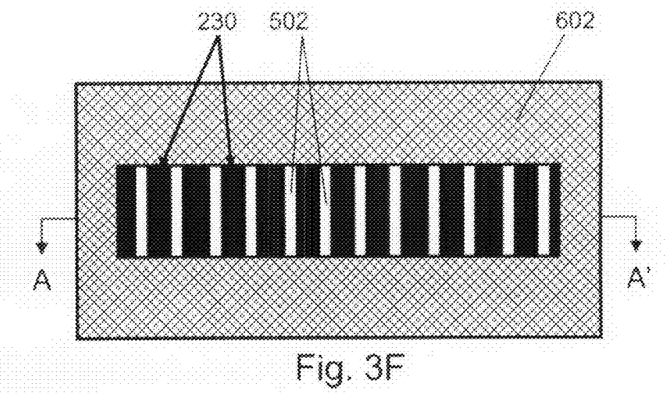

Additionally, etching the uncovered portions of layer 300 shown in FIG. 2E and FIG. 3E results in the formation of a plurality of contact holes 303 as shown in FIG. 2F, comprising for example, at least first, second and third contact holes. In other words, during the step of etching, the first contact hole is formed in underlying material below a location previously occupied by the first feature, the second contact hole is formed in the underlying material exposed between adjacent sidewall spacers, and the third contact hole is formed below a location previously occupied by the second feature. The first, second and third contact holes have about the same width and length. Thus, upon etching uncovered portions of layer 300, portions of second hard mask layer previously covered by the uncovered portions of layer 300 are exposed as shown in FIG. 3F. In some embodiments, the plurality of contact holes are arranged in at least one row as shown in FIG. 3F.

In one embodiment, mask layer 300 and the underlying layer 200 comprise at least one of DARC and hard mask located over an insulating layer, and the step of forming the plurality of contact holes includes etching the at least one of DARC and hard mask, and etching the insulating layer using at least one of patterned DARC and hard mask as a mask.

Figure 4A:
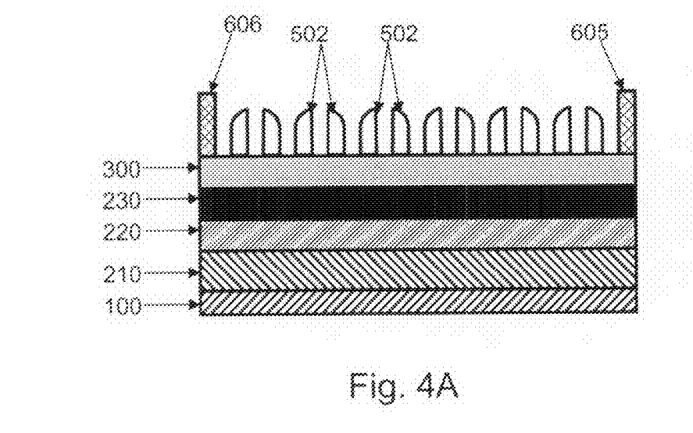
FIGS. 4A-4B are side cross-sectional views illustrating stages in formation of a device according to another embodiment of the invention.
Figure 4B:
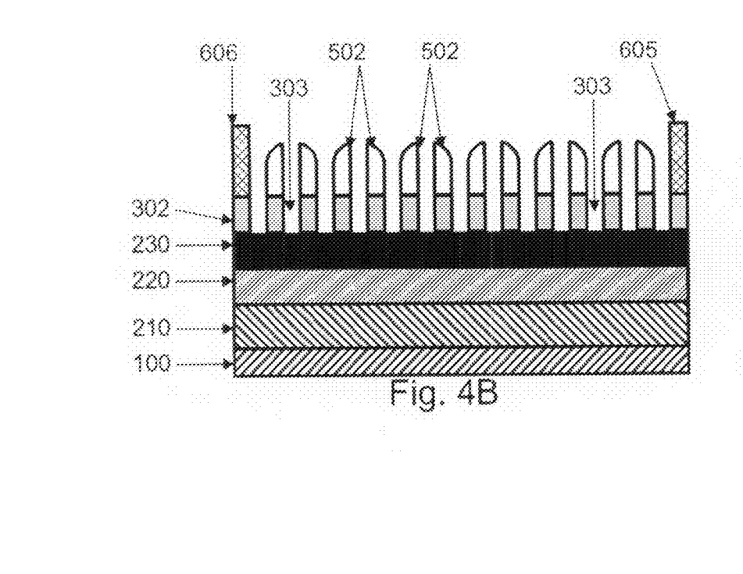
Figure 5A:
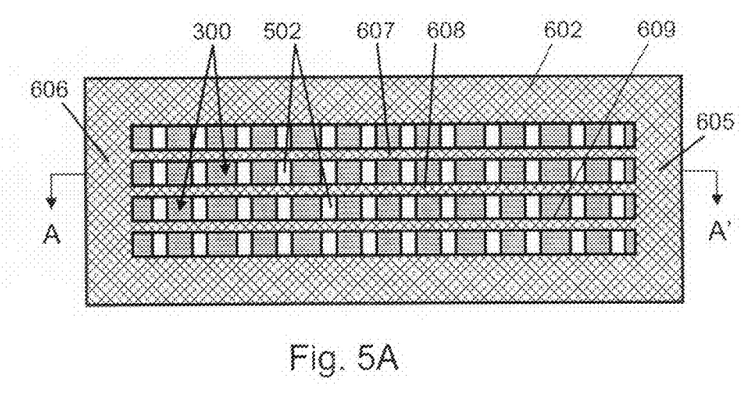
FIGS. 5A-5B are top views of the structures shown in FIGS. 4A-4B, respectively, with A-A' indicating the view in FIGS. 4A-4B.
Figure 5B:
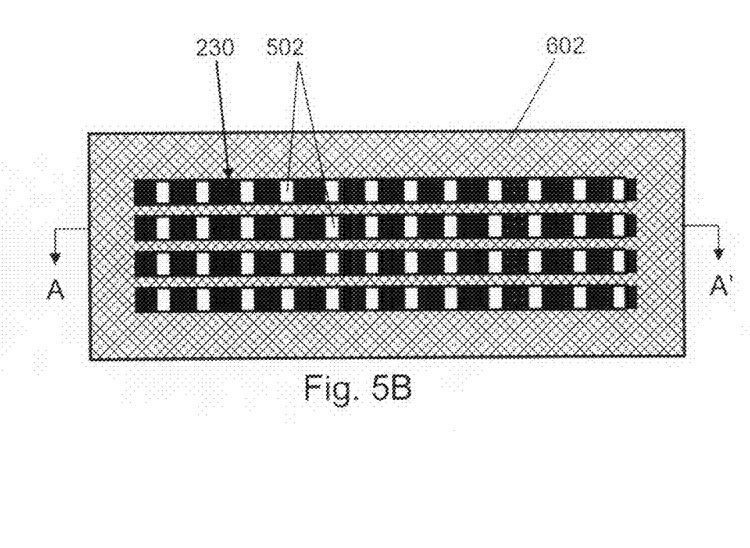

In another embodiment, the cover mask 602 covers the underlying layer, for example the first mask layer 300, outside of a length of the sidewall spacers 502 and covers strip portions of underlying material inside the length of the sidewall spacers. For example, in some embodiments, the cover mask 602 comprises at least one strip extending over the sidewall spacers such that at least two rows of non-staggered contact holes are formed. As shown in FIG. 4A and FIG. 5A, the cover mask 602 may comprise several strip portions 607, 608, 609 such that during a subsequent etching of layer 300, a plurality of non-staggered contact holes 303 are formed as an array, as shown in FIG. 4B and FIG. 5B.

In other words, beyond the cover mask configuration shown in FIG. 3E and described above, the cover mask may further comprise at least one additional fifth strip portion 607, 608, 609 of cover mask material formed substantially parallel to and between the first 603 and second 604 strip portions and over the spacer shells. A first end of the at least one additional fifth strip portion contacts the third strip portion 605, and a second end of the at least one additional fifth strip portion contacts the fourth strip portion 606, as shown in FIGS. 5A and 5B.

In some embodiments, each of the plurality of contact holes 303 has a rectangular cross-sectional shape. In some embodiments, the contact holes 303 have substantially rectangular cross-sectional shape. In some embodiments, the contact holes 303 have substantially square cross-sectional shape. In some embodiments, the plurality of contact holes are not staggered. In some embodiments, the contact holes formed below locations previously occupied by the features 401 have substantially the same shape as the contact holes formed at locations between adjacent spacer shells.

Each of the features 401 are preferably formed so as to substantially be 19 nm in width. However, due to variations in processing, features 401 may each vary from this preferred width by 0-10%, such as 1-5%. Also, it is preferred that the sidewall spacers 502 formed between each of the features 401 leaving a space making the same 19 nm width. Again, due to variations in processing, sidewall spacers 401 may each vary from this preferred width by 0-10%, such as 1-5%. Of course other widths may also be used.

In subsequent steps (not shown) additional etching processes may be used to increase the depth of the formed holes and/or to transfer patterns onto device layer 210. For example, subsequent etching steps may etch the hard mask layer 230 using sidewall spacers 502 and hard mask features 302 as masks thereby forming additional features from layer 230 that may subsequently be used as a mask for underlying layers during additional etching steps. For example, the device layer 210, such as insulating layer 210, may be etched to form a plurality of contact holes using any one or more layers 602, 502, 302 and/or patterned layers 230 and/or 220 as a mask.

In subsequent steps (not shown), conductive material such as metal silicide, metal or polysilicon electrodes, interconnects, etc. may be formed in the plurality of contact holes such that the conductive material contacts conductive lines or interconnects exposed in the plurality of contact holes. In other words, such lines or interconnects may be formed on the substrate 100 below layer 210 or be buried in layer 210. The method of making the contact holes described above may be used to form contact holes in any suitable semiconductor device, such as a logic or memory device. For example, the contact holes may be formed in a non-volatile memory device, such as a floating gate or charge storage transistor NAND type memory.

With the formation of non-staggered contact holes, a 19 nm or smaller resolution is possible with better contact uniformity compared with conventional methods. Alternatively, non-staggered contact holes having a larger surface area may be formed thereby resulting in lowered contact resistance and increased current for contacts formed in the holes.

It is noted that the method of forming cover mask 602 may take on several embodiments, so long as cover mask 602 is of such a pattern to create the contact hole patterns described above and shown in the figures. For example, cover mask 602 may be formed in several separate deposition steps to form the various strip portions, or during a single deposition step.

Thus, the embodiments of the present invention use a sidewall spacer or spacer shell technique and cover mask to pattern contact holes. This obviates the need for a staggered configuration for hole patterning, allowing for 19 nm or smaller resolution non-staggered hole arrays either in a smaller total area, thus allowing for a higher density of contact sites, or larger holes with a larger contact area for increased current and decreased contact resistance.

Figure 6A:
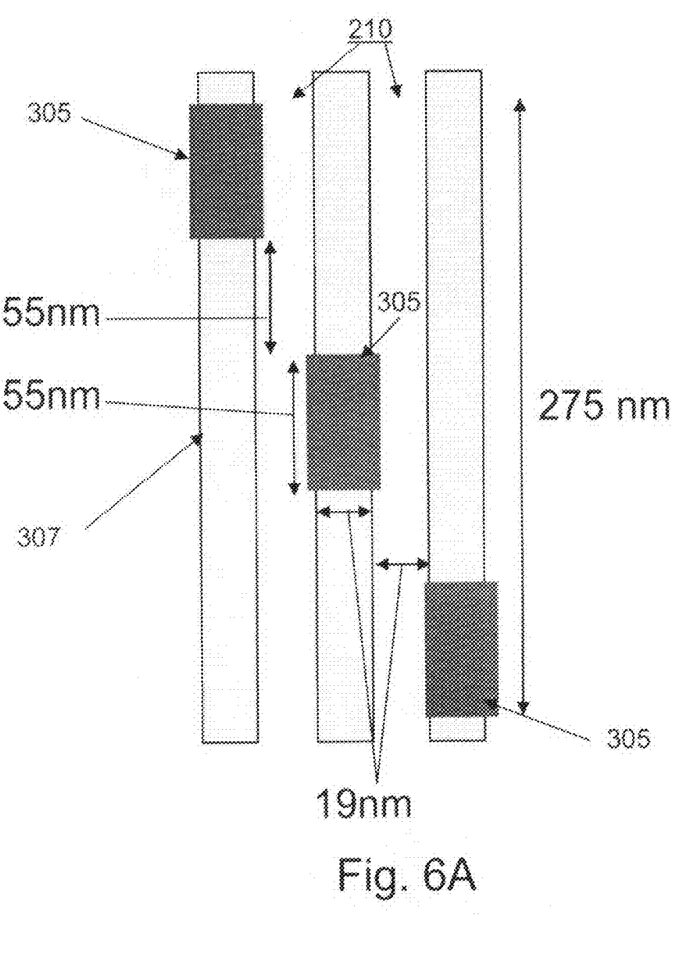
FIG. 6A is a top view of a comparative staggered contact hole pattern.

For example, dimensions of three various configurations that result in achieving 19 nm resolution contact holes are shown in the table below. In a comparative example, such as that shown in FIG. 6A, three contact holes 305 are formed in a staggered configuration. Each holes 305 may be located in a respective dual damascene type trench 307. In this comparative example, each hole has a width of 19 nm and a length of 55 nm. To form the staggered configuration, 19 nm is required in one horizontal direction (left to right in FIG. 6A) between adjacent holes while 55 nm is required in the other horizontal direction (top to down in FIG. 6A) between adjacent holes. Thus a total length of 275 nm of device layer 210 is required, and with the additional width, the die size is increased. In this comparative example, the contact area resulting from the staggered configuration is 1045 nm$^2$.

Figure 6B:
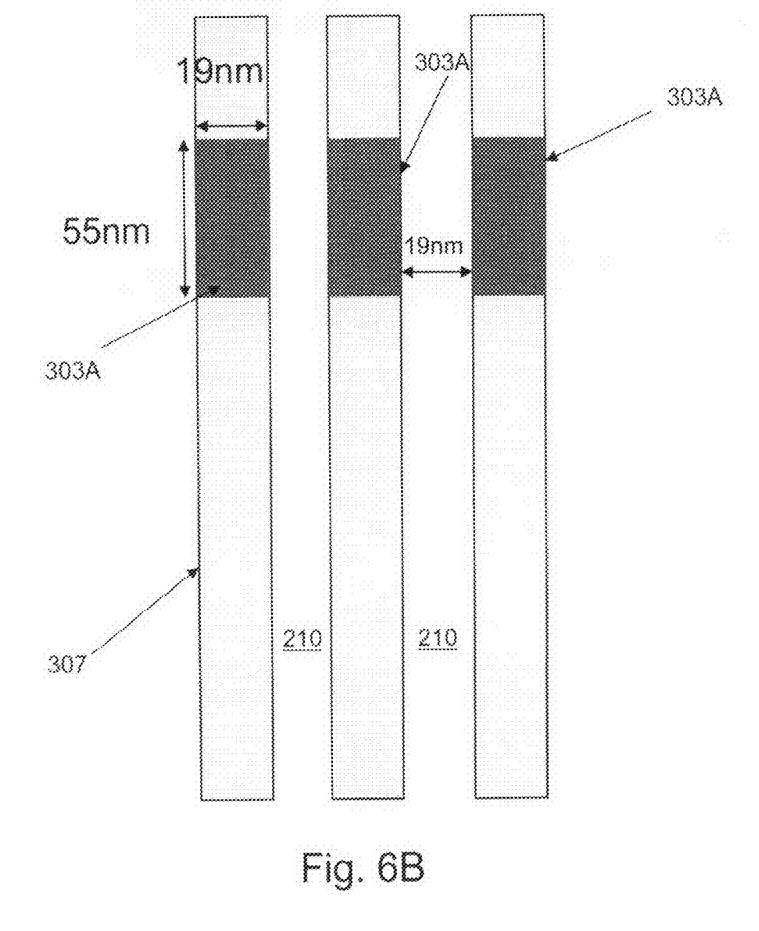
FIG. 6B is a top view of a non-staggered contact hole pattern formed according to an embodiment of the present invention.

Turning to FIG. 6B, a configuration in which the hole pattern is not staggered is shown. As seen in the table below, this configuration represents the minimum dimensions necessary for patterning three contact holes 303A, each having a 19 nm width and a 55 nm length. It is noted that the total contact area of the three holes in FIG. 6B is equal to that of the comparative example. However, because the holes in FIG. 6B are patterned side-by-side in a non-staggered configuration, the total length required for formation of holes 303A in a device layer 210 is only the total length of one hole at 55 nm. Furthermore, by patterning the holes following the sidewall and cover mask process described above for FIGS. 2A-2F, 3A-3F for example, the horizontal distance between holes is also minimized to 19 nm. A smaller total area necessary for the formation of the three contact holes is reduced while maintaining the total contact area. Thus, die size is decreased and an increased contact hole density may be realized.

Figure 6C:
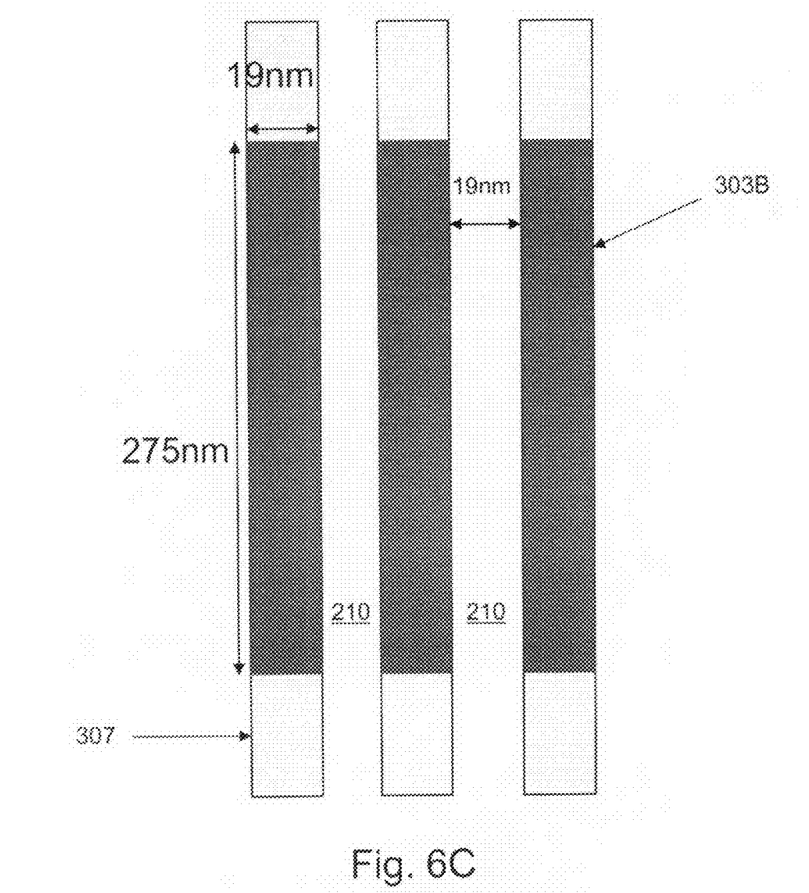
FIG. 6C is a top view of a non-staggered contact hole pattern formed according to another embodiment of the present invention.

Alternatively, as shown in FIG. 6C, longer holes 303B formed side-by-side in a non-staggered configuration in a device layer 210 may be formed utilizing an embodiment of the present invention. As shown in the table below, the longer holes 303B of FIG. 6C each have a length of 275 nm, equal to the total length required to form the staggered holes of FIG. 6A. Thus, a benefit of forming longer holes in a side-by-side fashion is increased contact area, such as 5225 nm$^2$ for the holes of FIG. 6C, as opposed to 1045 nm$^2$ for the holes of FIG. 6A, in the same total device area.

|  | Comparative Example (FIG. 6A) | Smaller Holes (FIG. 6B) | Larger Holes (FIG. 6C) |
|---|---|---|---|
| Width (nm) | 19 | 19 | 19 |
| Length = L | 55 | 55 | 275 |
| Contact area (nm$^2$) | 1045 | 1045 | 5225 |
| Total length required | 275 | 55 | 275 |

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of forming a plurality of contact holes, comprising:
    forming a first feature and a second feature over an underlying material;
    forming sidewall spacers on the first and second features;
    removing the first and second features without removing the sidewall spacers;
    forming a cover mask at least partially exposing the sidewall spacers; and
    etching the underlying material using the cover mask and the sidewall spacers as a mask to form the plurality of contact holes,
    wherein the cover mask comprises at least one strip extending over the sidewall spacers such that at least two rows of non-staggered contact holes are formed, wherein the contact holes comprise 19 nm or smaller resolution.

2. The method of claim 1, wherein:
the underlying material comprises an insulating material.

3. The method of claim 1, further comprising:
    forming a conductive material in the plurality of contact holes such that the conductive material contacts conductive lines exposed in the plurality of contact holes.

4. The method of claim 1, wherein:
each of the plurality of contact holes has a rectangular cross-sectional shape.

5. The method of claim 1, wherein:
the first and second features comprise photosensitive material features and the sidewall spacers comprise low temperature silicon oxide spacers.

6. The method of claim 1, wherein:
the first and second features comprise amorphous carbon features.

7. The method of claim 1, wherein:
the plurality of contact holes are not staggered.

8. The method of claim 1, wherein:
a width of the first feature is substantially equal to a width of the second feature and substantially equal to a width of a space between a sidewall spacer on the first feature and an adjacent sidewall spacer on the second feature.

9. The method of claim 1, wherein:
the plurality of contact holes are arranged in at least one row.

10. The method of claim 1, wherein:
the plurality of contact holes comprise first, second and third contact holes; and
during the step of etching, the first contact hole is formed in underlying material below a location previously occupied by the first feature, the second contact hole is formed in the underlying material exposed between adjacent sidewall spacers, and the third contact hole is formed below a location previously occupied by the second feature.

11. The method of claim 1, wherein:
the cover mask covers the underlying layer outside of a length of the sidewall spacers and covers strip portions of underlying material inside the length of the sidewall spacers.

12. The method of claim 1, wherein:
the underlying layer comprises at least one of DARC and hard mask located over an insulating layer, and the step of forming the plurality of contact holes comprises:
etching the at least one of DARC and hard mask; and
etching the insulating layer using at least one of patterned DARC and hard mask as a mask.

13. The method of claim 1, wherein:
the first feature comprises a photoresist upper portion and at least one of DARC and hard mask lower portion; and
the sidewall spacers cover sidewalls of the upper and lower portions of the first feature.

14. The method of claim 1, wherein the contact holes have a width of 19 nm or smaller.

15. A method of forming a plurality of contact holes, comprising:
    forming at least one underlying layer over a substrate;
    forming a plurality of spaced apart features over the at least one underlying layer;
    forming a spacer layer over the features and the at least one underlying layer;
    etching the spacer layer to form a spacer pattern comprising a plurality of spacer shells, wherein each one of the spacer shells is formed so as to completely surround sidewalls of a respective one of the features while exposing an upper surface of each feature and portions of the underlying layer located between adjacent spacer shells;
    removing the features without removing the spacer shells to expose top portions of the underlying layer below locations previously occupied by the features;
    forming a cover mask comprising at least a first strip portion and a second strip portion of cover mask material formed spaced apart and substantially parallel to one another such that the first strip portion covers a first wall and the second strip portion covers an opposing second wall of each of the spacer shells; and
    etching exposed portions of the underlying layer below locations previously occupied by the features and at locations between each of the plurality of spacer shells to form the plurality of contact holes;

wherein the cover mask further comprises:
- a third strip portion of cover mask material formed above the underlying layer thereby connecting a first end of the first strip portion and a first end of the second strip portion;
- a fourth strip portion of cover mask material formed above the underlying layer thereby connecting a second end of the first strip portion and a second end of the second strip portion; and
- at least one additional fifth strip portion of cover mask material formed substantially parallel to and between the first and second strip portions and over the spacer shells;

wherein:
- the third and fourth strip portions are each substantially perpendicular to the first and second strip portions, and the spacer shells are located between the third and fourth strip portions;
- a first end of the at least one additional fifth strip portion contacts the third strip portion, and a second end of the at least one additional fifth strip portion contacts the fourth strip portion; and
- the contact holes have a substantially square cross-sectional shape.

16. The method of claim 15, wherein:
the contact holes formed below locations previously occupied by the features have a substantially the same shape as the contact holes formed at locations between adjacent spacer shells.

17. The method of claim 15, wherein the contact holes have a width of 19 nm or smaller.

* * * * *